(12) United States Patent
Hirano et al.

(10) Patent No.: US 6,713,877 B2
(45) Date of Patent: Mar. 30, 2004

(54) LIGHT-EMITTING DIODE

(75) Inventors: Atsuo Hirano, Aichi-ken (JP); Yukio Yoshikawa, Tokyo (JP); Kiyotaka Teshima, Tokyo (JP); Takemasa Yasukawa, Aichi-ken (JP)

(73) Assignees: Toyoda Gosei Co., Ltd., Aichi-ken (JP); Koha Co., Ltd., Tokyo (JP)

( * ) Notice: Subject to any disclaimer, the term of this patent is extended or adjusted under 35 U.S.C. 154(b) by 0 days.

(21) Appl. No.: 10/137,836

(22) Filed: May 3, 2002

(65) Prior Publication Data

US 2002/0145205 A1 Oct. 10, 2002

Related U.S. Application Data

(62) Division of application No. 09/493,183, filed on Jan. 28, 2000, now Pat. No. 6,445,011.

(30) Foreign Application Priority Data

Jan. 29, 1999 (JP) .......................................... H11-22727
Aug. 6, 1999 (JP) ......................................... H11-224608

(51) Int. Cl.⁷ ....................... H01L 33/00; H01L 23/495; H01L 29/40
(52) U.S. Cl. ........................... 257/778; 257/99; 257/676
(58) Field of Search ........................... 257/99, 676, 778

(56) References Cited

U.S. PATENT DOCUMENTS

| | | |
|---|---|---|
| 5,557,115 A | 9/1996 | Shakuda |
| 5,998,925 A | 12/1999 | Shimizu et al. |
| 6,054,716 A * | 4/2000 | Sonobe et al. ............... 250/552 |
| 6,121,637 A | 9/2000 | Isokawa et al. |
| 6,445,011 B1 * | 9/2002 | Hirano et al. .................. 257/99 |

FOREIGN PATENT DOCUMENTS

| | | | |
|---|---|---|---|
| JP | 11-186326 | * | 7/1999 |
| JP | 11289110 A | | 10/1999 |
| JP | 11-354848 | * | 12/1999 |

* cited by examiner

*Primary Examiner*—George Eckert
*Assistant Examiner*—Joseph Nguyen
(74) *Attorney, Agent, or Firm*—McGinn & Gibb, PLLC

(57) ABSTRACT

In a light-emitting diode, a substantially square flip chip is placed on a substantially square sub-mount at a position and posture which are obtained through superposition of a center point and center axis of the flip chip on a center point and center axis of the sub-mount and subsequent rotation of the flip chip about the center points by approximately 45°. Therefore, triangular exposed regions are formed on the sub-mount, in which two lead electrodes for the flip chip can be formed. As a result, the flip chip can be placed on a lead frame such that the center axis of the flip chip coincides with the center axis of a parabola of the lead frame. Further, the sub-mount is formed of a semiconductor substrate, and a diode for over-voltage protection is formed within the semiconductor substrate. Therefore, breakage of the light-emitting diode due to excessive voltage can be prevented.

13 Claims, 12 Drawing Sheets

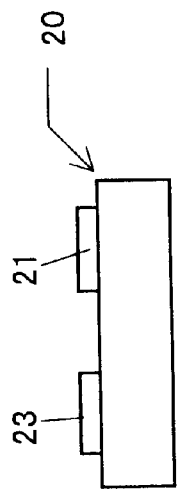
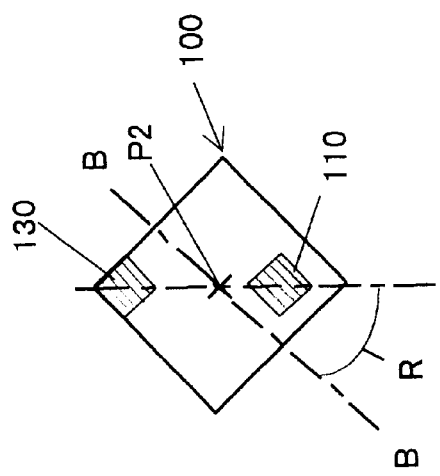
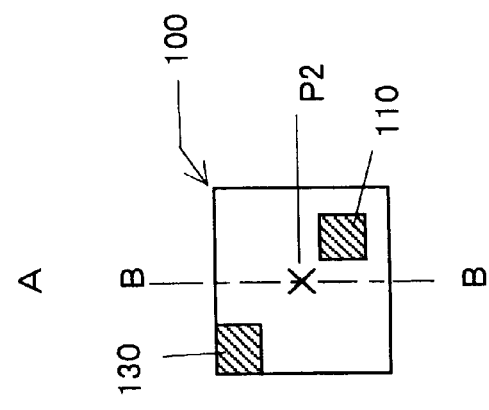
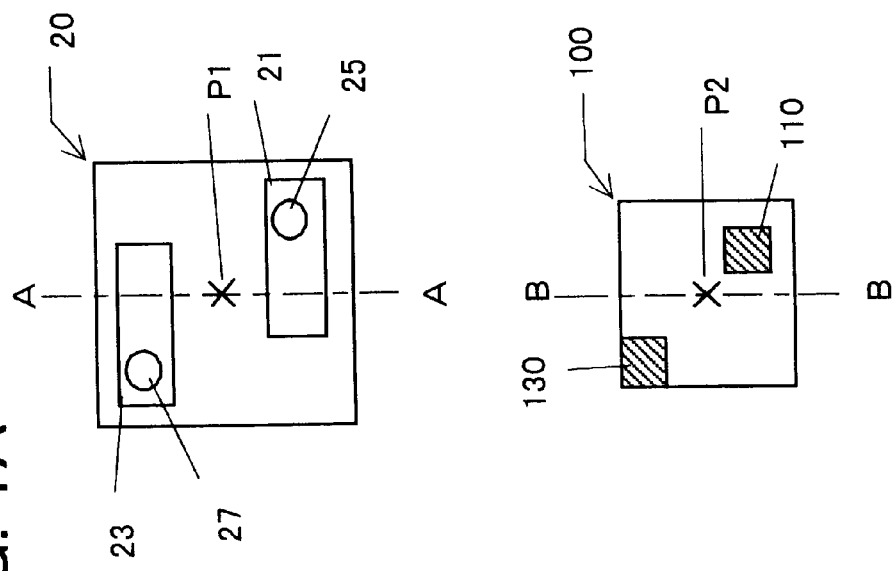

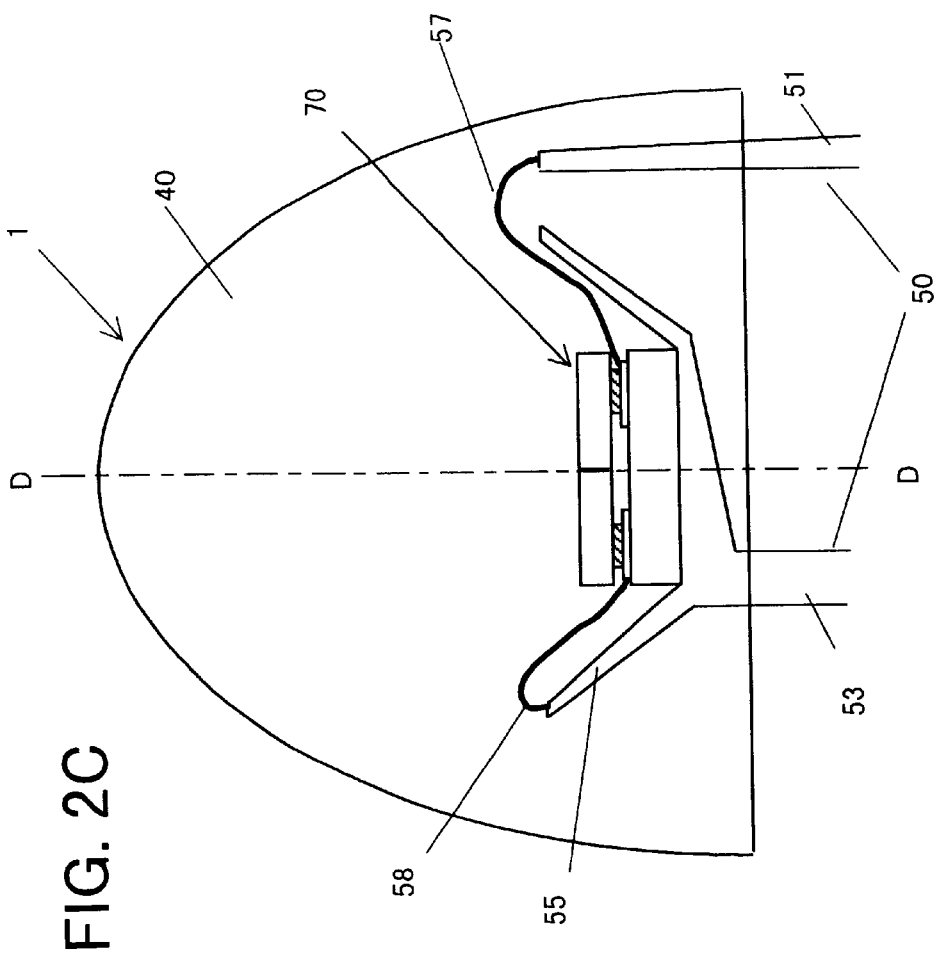
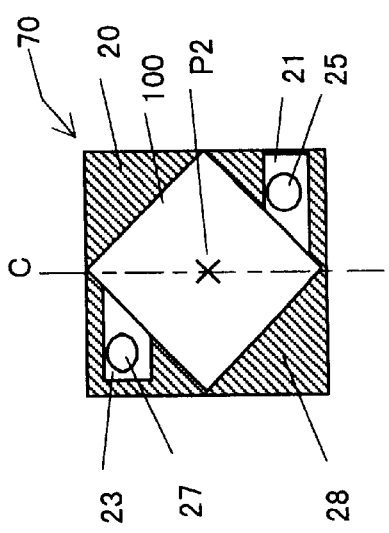
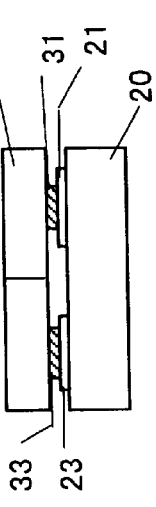

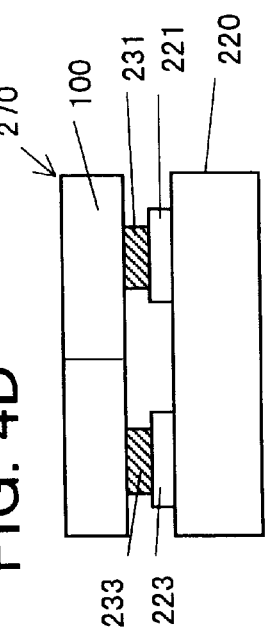
FIG. 4C
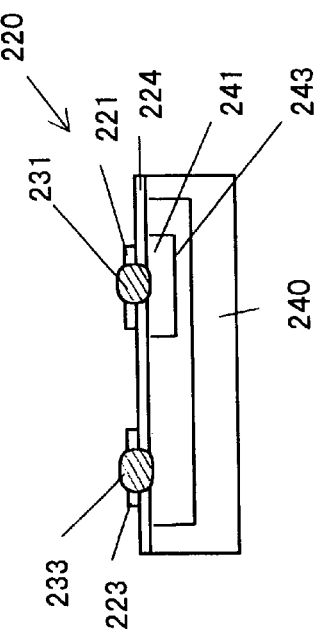
FIG. 4D
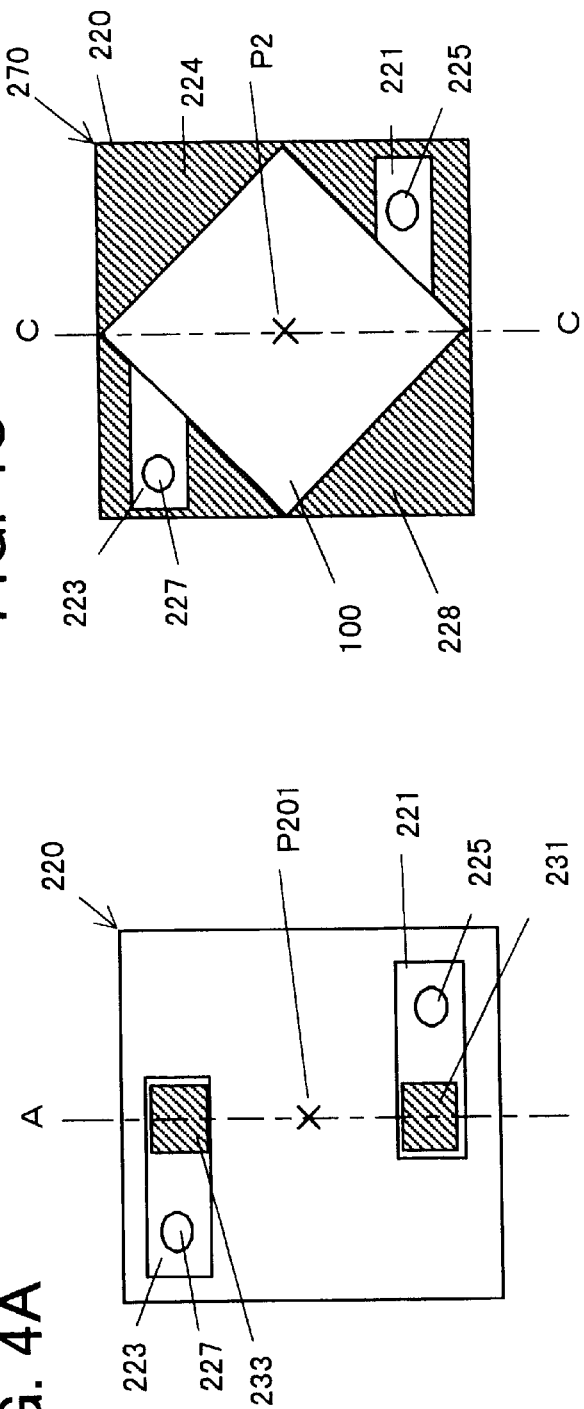
FIG. 4A
FIG. 4B

LIGHT-EMITTING DIODE

This is a divisional application of U.S. appln. Ser. No. 09/493,183, which was filed on Jan. 28, 2000 U.S. Pat. No. 6,445,011 and whose contents are incorporated in its entirety by reference.

BACKGROUND OF THE INVENTION

1. Field of the Invention

The present invention relates to a light-emitting diode using a flip-chip-type light-emitting element having a widened light-emitting surface.

2. Description of the Related Art

A conventional light-emitting diode 5 which uses a flip-chip-type semiconductor light-emitting element will be described with reference to FIGS. 12 and 13. FIG. 13 is a vertical cross section schematically showing the appearance and structure of the conventional light-emitting diode 5, which comprises a flip-chip-type semiconductor light-emitting element 100 (hereinafter referred to as the "flip chip 100"). FIG. 12 depicts a light-emitting element member 570 that is formed of a sub-mount 520 serving as a substrate and the flip chip 100 mounted thereon.

A lead frame 50 is composed of a metal post 51 and a metal stem 53, which are used for application of voltage to the light-emitting element member 570. The metal stem 53 has a reflection portion 55 and a flat portion 54 on which the light-emitting element member 570 is placed. A resin mold 40 encloses the light-emitting element member 570. The bottom surface 527 of the light-emitting element member 570 is bonded to the metal stem 53 by use of silver paste or any other suitable material, to thereby be electrically connected thereto. An electrode 521 is formed on the sub-mount 520 to be located in an exposed portion 528 thereof. The electrode 521 is connected to the metal post 51 through wire bonding using gold wire 57.

Light emitted by the flip chip 100 reflects off a positive electrode disposed on a first main face, passes through a sapphire substrate disposed on a second main face, and then radiates to the outside. Therefore, the flip chip 100 is mounted on the sub-mount 520 in a face-down orientation such that the first main face faces downward.

Next, the sub-mount 520 serving as a substrate will be described. FIG. 12A is a plan view of the sub-mount 520 before attachment of the flip chip 100; FIG. 12B is a plan view of the sub-mount 520 after attachment of the flip chip 100; and FIG. 12C is a cross sectional view of the sub-mount 520 after attachment of the flip chip 100.

The sub-mount 520 is formed of, for example, an electrically conductive semiconductor substrate. The upper surface of the sub-mount 520 is covered with an insulation film 524 made of $SiO_2$ except for a portion 523, to which an Au micro-bump 533 is soldered for establishing connection with the positive electrode of the flip chip 100. A negative electrode 521 is formed on the insulation film 524 by means of aluminum vapor deposition. On the negative electrode 521 are defined a pad region in which the negative electrode 521 is wire-bonded to the metal post 51 and a region in which an Au micro-bump 531 is soldered to the negative electrode 521 in order to establish connection with the negative electrode of the flip chip 100.

Conventionally, in order to perform wire bonding, there must be formed a circular bonding pad region having a diameter of at least 100 $\mu$m, or a square bonding pad region, each side of which has a length of at least 100 $\mu$m. In order to allow formation of the electrode 521 providing such a bonding pad region on the exposed portion 528 of the sub-mount 520, as shown in FIG. 12B, the flip chip 100 having a square shape must be disposed on the sub-mount 520 at a position offset toward one side. That is, since the exposed portion 528 must be formed to have a predetermined area or greater, the flip chip 100 cannot be disposed on the sub-mount 520 such that the center P2 of the flip chip 100 coincides with the center P501 of the sub-mount 520 and the center axis (indicated by broken line B—B in FIG. 12B) of the flip chip 100 coincides with the center axis (indicated by broken line A—A in FIGS. 12A and 12A) of the sub-mount 520. Further, when the light-emitting element member 570 is placed on the flat portion 54 having substantially the same area as the light-emitting element member 570, the center axis A—A of the sub-mount 520 inevitably coincides with the center axis (indicated by broken line D—D in FIG. 13) of the reflection portion 55 having a parabolic shape.

As described above, the sub-mount 520 must have the exposed portion 528 in order to enable formation of the electrode 521 serving as a bonding pad which is used for wiring between the flip chip 100 and the metal post 51. Therefore, the sub-mount 520 has a rectangular shape. In addition, the flip chip 100 is disposed on the sub-mount 520 in an offset manner, so that the center axis of the flip chip 100 deviates from the center axis of the reflection portion 55 of the lead frame 50. Therefore, the conventional light-emitting diode 5 has a drawback in that luminous intensity changes with position of view; i.e., luminous intensity differs according to whether the diode 5 is viewed from the right side or left side, or from the upper side or lower side. Further, since the area of the flat portion 54 of the lead frame 50 is small, the area of the sub-mount 520 inevitably becomes small. Therefore, if there is employed a design in which the flip chip 100 is disposed on the sub-mount 520 such that the center axis of the flip chip 100 coincides with that of the rectangular sub-mount 520, and the exposed portion for formation of an attachment electrode is secured, the size of the flip chip 100 decreases, so that a required luminance cannot be obtained.

SUMMARY OF THE INVENTION

In view of the foregoing, an object of the present invention is to provide a light-emitting diode which provides constant luminous intensity regardless of position of view.

Another object of the present invention is to provide a light-emitting diode in which the area of a flip chip is maximized in order to secure high luminance, while a region for an electrode for electrical connection is secured on a sub-mount.

Still another object of the present invention is to provide a light-emitting diode which has a reduced overall size and improved durability and which can be fabricated through a simplified fabrication process.

In order to achieve the above-described objects, according to a first aspect of the present invention, there is provided a light-emitting diode using a flip chip which is a flip-chip-type semiconductor light-emitting element, comprising: a rectangular flip chip; and a rectangular sub-mount on which the flip chip is placed. The sub-mount has a shorter side longer than a diagonal of the flip chip. The flip chip is placed on the sub-mount such that a side of the flip chip intersects a corresponding side of the sub-mount.

According to a second aspect of the present invention, there is provided a light-emitting diode using a flip chip which is a flip-chip-type semiconductor light-emitting element, comprising a substantially square flip chip; and a substantially square sub-mount on which the flip chip is placed. The flip chip is placed on the sub-mount at a position and posture which are obtained through superposition of a center point and center axis of the flip-chip on a center point and center axis of the sub-mount and subsequent rotation of the flip chip about the center points by a predetermined angle. Here the term of a substantially square means the figure including a parallelogram, a trapezoid, or a quadrangle which is slightly shifted from a right square.

According to a third aspect of the present invention, the predetermined angle is about 45 degrees.

According to a fourth aspect of the present invention, the sub-mount is formed of a semiconductor substrate, and a diode for over-voltage protection is formed within the semiconductor substrate.

According to a fifth aspect of the present invention, the diode for over-voltage protection is formed to be located below an upper exposed region of the sub-mount.

According to a sixth aspect of the present invention, the sub-mount is formed of a semiconductor substrate having an insulation film formed on an upper surface of the substrate; and at least one of two lead electrodes for the flip chip is formed on the insulation film to be located in an upper exposed region remaining after placement of the flip chip.

According to a seventh aspect of the present invention, a bottom surface of the semiconductor substrate serves as one of two lead electrodes for the flip chip; and the semiconductor substrate is directly connected to a lead frame adapted for receiving the semiconductor substrate and application of voltage to the flip chip.

According to an eighth aspect of the present invention, the semiconductor substrate is insulative; and two lead electrodes for the flip chip are formed on the sub-mount to be located in an upper exposed region remaining after placement of the flip chip.

According to a ninth aspect of the present invention, the sub-mount is insulative; and two lead electrodes for the flip chip are formed on the sub-mount to be located in an upper exposed region remaining after placement of the flip chip.

According to a tenth aspect of the present invention, a mark for detecting position or posture of the sub-mount is formed on the upper exposed region of the sub-mount.

According to an eleventh aspect of the present invention, a reflection film for reflecting light emitted from the flip chip is formed on the sub-mount.

According to a twelfth aspect of the present invention, a lead electrode which is provided for the flip chip and serves as a refection film for reflecting light emitted from the flip chip is formed on the sub-mount.

According to a thirteenth aspect of the present invention, the two lead electrodes are formed to cover an area below the flip chip and serve as refection films for reflecting light emitted from the flip chip.

According to a fourteenth aspect of the present invention, the two lead electrodes are formed to cover substantially the entirety of an upper surface of the sub-mount and serve as reflection films for reflecting light emitted from the flip chip.

In the light-emitting diode according to the first aspect, since the flip chip is disposed on the sub-mount while being rotated with respect thereto, exposed regions not covered by the flip chip are present at four corners of the sub-mount. Electrodes for wiring can be formed in the exposed regions. Accordingly, the optical axis of the flip chip can be placed at an approximate center of the sub-mount, while the area of the flip chip is maximized. As a result, when the sub-mount is placed on a lead frame, the optical axis of the flip chip coincides with an approximate center of the lens frame. In other words, the optical axis of the flip chip coincides with the center axis of a lamp, so that uniform luminous intensity distribution is obtained without sacrifice of luminance.

In the light-emitting diode according to the second aspect, the substantially square flip chip is placed on the substantially square sub-mount at a position and posture which are obtained through superposition of a center point and center axis of the flip-chip on a center point and center axis of the sub-mount and subsequent rotation of the flip chip about the center points by a predetermined angle. Therefore, even when the substantially square flip chip is placed on the substantially square sub-mount such that their centers coincide with each other, triangular exposed regions are formed on the sub-mount, in which lead electrodes can be formed. As a result, without necessity of decreasing the size of the flip chip, the flip chip can be placed on the sub-mount such that their centers coincide with each other, and upper exposed regions used for formation of lead electrodes can be secured on the sub-mount.

Further, since the sub-mount is formed in a substantially square shape, the sub-mount carrying the flip chip can be placed on a lead frame such that the center and center axis of the sub-mount coincide with the center and center axis of a parabola of the lead frame. As a result, constant luminous intensity can be provided regardless of position of view. Since the ratio of the area of the sub-mount to that of the parabola can be maximized, the size of the flip chip itself can be increased. Therefore, without an increase in the size of the light-emitting diode itself, the luminance can be increased.

In the light-emitting diode according to the third aspect, since the angle of rotation is set to about 45 degrees, the ratio of the area of the flip chip to that of the sub-mount can be maximized, and the light-emitting diode can provide further increased luminance.

In the light-emitting diode according to the fourth aspect, the sub-mount is formed of a semiconductor substrate, and a diode for over-voltage protection is formed within the semiconductor substrate. Therefore, the diode for over-voltage protection such as a Zener diode is connected in parallel to the light-emitting diode, and breakage of the light-emitting diode due to excessive voltage is prevented, so that the durability of the light-emitting diode is expectedly improved.

In the light-emitting diode according to the fifth aspect, since the diode for over-voltage protection is formed within the semiconductor substrate to be located below an upper exposed region of the sub-mount, heat is easily radiated from the protection diode, so that thermal breakage of the protection diode is prevented. Since the protection diode is formed outside a region where bumps are formed to establish connection between the flip chip and the sub-mount, the protection diode is not affected by heat generation of bumps, and thermal breakage of the protection diode is effectively prevented.

In the light-emitting diode according to the sixth aspect, electrodes can be formed on the insulation film, and a semiconductor element, such as a diode, for over-voltage protection can be formed within the semiconductor substrate.

In the light-emitting diode according to the seventh aspect, a bottom surface of the semiconductor substrate constituting the sub-mount serves as one of two lead electrodes for the flip chip; and the semiconductor substrate is directly connected to a lead frame adapted for receiving the semiconductor substrate and application of voltage to the flip chip. This structure eliminates necessity of formation of one lead electrode for the flip chip on the sub-mount.

In the light-emitting diode according to the eighth aspect, the semiconductor substrate constituting the sub-mount is insulative; and two lead electrodes for the flip chip are formed on the sub-mount to be located in an upper exposed region of the sub-mount remaining after placement of the flip chip. Since the semiconductor substrate used for the sub-mount may be insulative, the range of selection of constituent materials is widened.

In the light-emitting diode according to the ninth aspect, the sub-mount is insulative; and two lead electrodes for the flip chip are formed on the sub-mount to be located in an upper exposed region remaining after placement of the flip chip. Therefore, the lead electrodes can be wire-bonded to the lead frame used for application of voltage to the flip chip.

In the light-emitting diode according to the tenth aspect, a mark for detecting position or posture of the sub-mount is formed on the upper exposed region of the sub-mount. Therefore, alignment between the flip chip and the sub-mount, and control of position and orientation of the sub-mount during operation for connecting the sub-mount and the lead frame by wire bonding are facilitated.

In the light-emitting diode according to the eleventh aspect, the reflection film reflects light emitted from the flip chip, so that the light can be effectively radiated to the outside.

In the light-emitting diodes according to the twelfth, thirteenth, and fourteenth aspects, since the lead electrodes for the flip chip are used to reflect light emitted from the flip chip, the structure can be simplified, and the light can be effectively radiated to the outside.

BRIEF DESCRIPTION OF THE DRAWINGS

FIGS. 1A–1D and FIGS. 2A–2C are explanatory views showing the structure of a light-emitting diode according to a first embodiment of the present invention;

FIGS. 4A–4D and FIG. 5 are explanatory views showing the structure of a light-emitting diode according to a second embodiment of the present invention;

DESCRIPTION OF THE PREFERRED EMBODIMENTS

The present invention will be described by way of specific embodiments. However, the present invention is not limited to the embodiments.

Figure 3A:
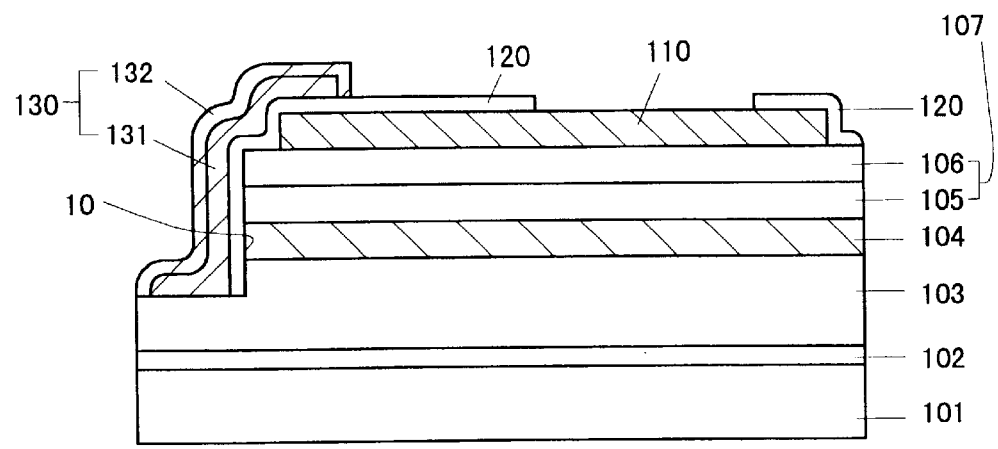
FIGS. 3A and 3B are explanatory views showing the structure of a flip-chip-type light-emitting element used in the present invention.
Figure 3B:
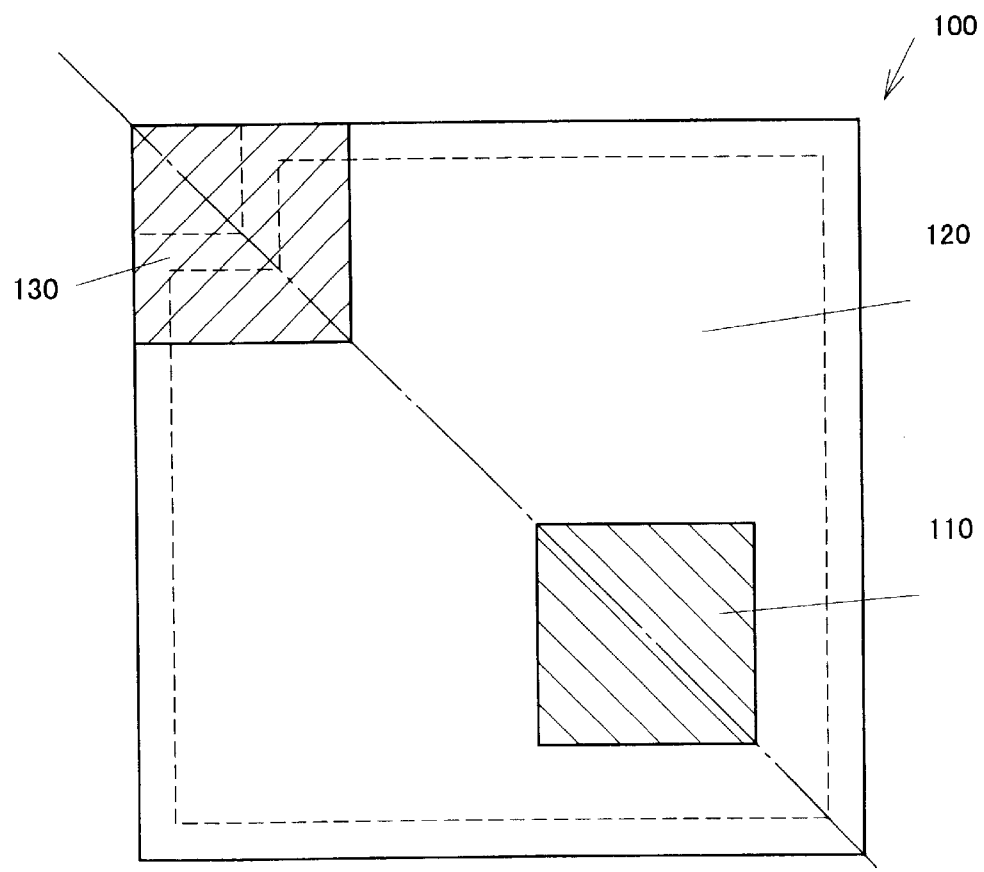

First, the structure of a flip chip 100 formed of a gallium nitride compound semiconductor will be described. FIGS. 3A and 3B respectively show cross-sectional and plan views of the flip chip 100. Reference numeral 101 denotes a sapphire substrate; 102 denotes a buffer layer formed of aluminum nitride (AlN); 103 denotes an n-type gallium nitride compound semiconductor layer formed of silicon (Si)-doped gallium nitride (GaN) having a high carrier density; 104 denotes an active layer formed of $In_xGa_{1-x}N$ (0<x<1); 107 denotes a p-type gallium nitride compound semiconductor layer comprising a p cladding layer 105 formed of p-type $Al_yGa_{1-y}N$ (0<y<1) and a p contact layer 106 formed of p-type gallium nitride (GaN); 110 denotes a positive electrode formed of nickel (Ni); 120 denotes an insulating protective film formed of $SiO_2$; and 130 denotes a negative electrode comprising a metal layer 131 formed of silver (Ag) and a metal layer 132 formed of nickel (Ni).

In the flip chip 100, the insulating protective film 120 is formed to cover a side wall surface 10 of the n-type gallium nitride compound semiconductor layer 103 formed through etching, as well as side wall surfaces 10 of the respective layers formed on the n-type gallium nitride compound semiconductor layer 103. The insulating protective film 120 is extended to reach the upper exposed surface of the positive electrode 110 formed on the p-type gallium nitride compound semiconductor layer 107. The negative electrode 130 is formed on the insulating protective film 120 such that the negative electrode 130 extends upward from an upper exposed surface of the n-type gallium nitride compound semiconductor layer 103 along the insulating protective film 120.

FIG. 1A is a plan view of a sub-mount 20. FIG. 1B is a vertical cross-sectional view of the sub-mount 20 taken along broken line A—A in FIG. 1A. The broken line A—A also represents a center axis passing through a center P1 of the sub-mount 20. FIG. 1C is a plan view of the flip chip 100 as viewed from the bottom surface side or electrode side. FIG. 1D is a plan view corresponding to FIG. 1C but in a state in which the flip chip 100 has been rotated about a center P2 by an angle R. In the present embodiment, the angle R is about 45 degrees. FIG. 2A is a plan view of a light-emitting element member 70 in which the flip chip 100 is mounted on the sub-mount 20 in such a manner that the flip chip 100 is rotated about 45 degrees about the center P2 after being placed such that the center axis A—A of the sub-mount 20 coincides with the center axis B—B of the flip chip 100. FIG. 2B is a vertical cross-sectional view of the light-emitting element member 70 taken along broken line C—C in FIG. 2A. FIG. 2C is a vertical cross-sectional view schematically showing the appearance and structure of the light-emitting diode 1 according to the first embodiment, in which the light-emitting element member 70 is mounted on a lead frame 50.

The sub-mount 20 serving as a substrate is formed of an insulating material such as a ceramic or resin. A positive electrode 21 and a negative electrode 23 each having a strip shape are formed on the surface of the sub-mount 20 through vapor deposition of aluminum. Specifically, the positive electrode 21 and the negative electrode 23 are formed in upper exposed regions 28 having the shapes of right-angled isosceles triangles 28 (hatched regions in FIG. 2A) formed as result of placement of the flip chip 100 with rotation of about 45 degrees. The positive electrode 21 extends from one of diagonally opposite corners to a region where the positive electrode 110 of the flip chip 100 is placed, and the negative electrode 23 extends from the other corner to a region where the negative electrode 130 of the flip chip 100 is placed.

The light-emitting element member 70 is assembled in the following manner. First, the flip chip 100 is placed on the sub-mount 20 at a position and posture as shown in FIG. 2, which are obtained through 45-degree rotation of the flip chip 100 about the center P1 from a position at which the center P1 of the sub-mount 20 coincides with the center P2 of the flip chip 100 and the center axis A—A of the sub-mount 20 coincides with the center axis B—B of the flip chip 100. At this position, the positive electrode 110 of the flip chip 100 is electrically connected and soldered to the positive electrode 21 of the sub-mount 20 via a micro-bump 31 of Au, and the negative electrode 130 of the flip chip 100 is electrically connected and soldered to the negative electrode 23 of the sub-mount 20 via a micro-bump 33 of Au. Thus, the flip chip 100 is fixedly mounted on the sub-mount 20.

A gold wire 57 extending from a metal post 51 is bonded to a bonding pad portion 25 of the positive electrode 21 formed on the sub-mount 20, and a gold wire 58 extending from a metal stem 53 is bonded to a bonding pad portion 27 of the positive electrode 23 formed on the sub-mount 20. The light-emitting element member 70 is placed on a parabolic reflection portion 55 of the lead frame 50 such that the center of the light-emitting element member 70 coincides with the center axis of the parabolic reflection portion 55 (as indicated by broken line D—D in FIG. 2C). Subsequently, the lead frame 50 and the light-emitting element member 70 are enclosed by use of a resin mold 40.

The above-described structure enables fabrication of the light-emitting diode 1 in which all the center axes of the flip chip 100, the sub-mount 20, the parabolic reflection portion 55, and the resin mold 40 coincide with one another. Therefore, the light-emitting diode 1 can provide constant luminous intensity regardless of position of view; i.e. the light-emitting diode 1 can provide uniform or constant luminance on a plane perpendicular to the center axis of the light-emitting diode 1. Further, without an increase in the size of the light-emitting diode 1 itself, the size of the flip chip 100 can be increased in order to increase luminance.

Next, a light-emitting diode 2 according to a second embodiment will be described with reference to FIGS. 4A–4D and FIG. 5.

Figure 5:
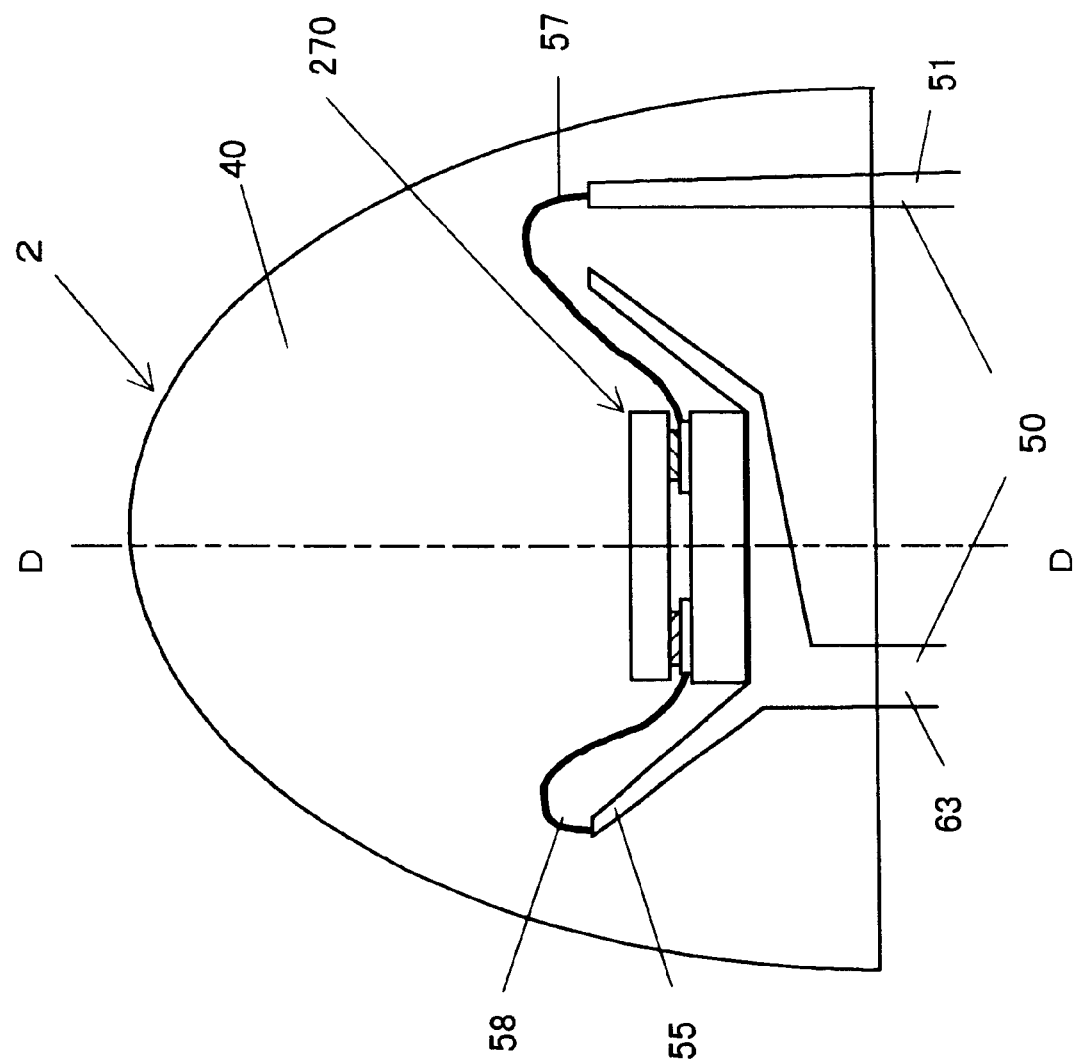

FIG. 4A is a plan view of a sub-mount 220. FIG. 4B is a vertical cross-sectional view of the sub-mount 220 taken along broken line A—A in FIG. 4A. FIG. 4C is a plan view of a light-emitting element member 270 in which the flip chip 100 is mounted on the sub-mount 220 in such a manner that the flip chip 100 is rotated about 45 degrees about the center P2 after being placed such that the center axis A—A passing through the center P201 of the sub-mount 220 coincides with the center axis B—B passing through the center P2 of the flip chip 100. FIG. 4D is a vertical cross-sectional view of the light-emitting element member 270 taken along broken line C—C in FIG. 4C. FIG. 5 is a vertical cross-sectional view schematically showing the appearance and structure of the light-emitting diode 2 according to the second embodiment, in which the light-emitting element member 270 is mounted on the lead frame 50. The structure of the flip chip 100 of the second embodiment is the same as that of the first embodiment shown in FIGS. 1C, 1D, 3A, and 3B.

The sub-mount 220 serving as a substrate is formed of an insulative semiconductor substrate such as a silicon (Si) substrate 240. A p-layer 243 serving as a lower layer is formed in the silicon substrate 240 through doping of a group III element. Subsequently, through doping of a group V element, an n-layer 241 is formed at a portion to which the positive electrode 110 of the flip chip 100 is bonded via a micro-bump 231. The thus-formed p-layer 243 and the n-layer 241 constitute a pn-junction diode, which functions as a Zener diode when the positive electrode 110 of the flip chip 100 is connected to the n-layer 241 and the negative electrode 130 of the flip chip 100 is connected to the p-layer 243. The forward operation voltage of the Zener diode is preferably lower than the reverse-direction breakdown voltage of the flip chip 100, and the reverse-direction breakdown voltage of the Zener diode is preferably higher than the operation voltage of the flip chip 100 but lower than the forward-direction breakdown voltage of the flip chip 100.

Subsequently, the entire upper surface of the sub-mount 220 is covered with an insulation film 224 formed of $SiO_2$. A positive electrode 221 and a negative electrode 223 each having a strip shape are formed on the surface of the sub-mount 220 through vapor deposition of aluminum. Specifically, the positive electrode 221 and the negative electrode 223 are formed in triangular upper exposed regions remaining after placement of the flip chip 100 with rotation of about 45 degrees. The positive electrode 221 extends from one of diagonally opposite corners to a region where the positive electrode 110 of the flip chip 100 is placed, and the negative electrode 223 extends from the other corner to a region where the negative electrode 130 of the flip chip 100 is placed. Further, a window reaching the n-layer 241 is formed by etching in the insulation film 224 at a portion of the positive electrode 221 where the micro-bump 231 is formed. Similarly, a window reaching the p-layer 243 is formed by etching in the insulation film 224 at a portion of the negative electrode 223 where the micro-bump 233 is formed.

The light-emitting element member 270 is assembled in the following manner. First, the flip chip 100 is placed on the sub-mount 220 at a position and posture which are obtained through 45-degree rotation of the flip chip 100 about the center P2 from a position at which the center axis A—A passing through the center P201 of the sub-mount 220 coincides with the center axis B—B passing through the center P2 of the flip chip 100. At this position, the positive electrode 110 of the flip chip 100 is electrically connected and soldered to the positive electrode 221 of the sub-mount 220 and the n-layer 241 of the sub-mount 220 via the micro-bump 231 of Au. Similarly, the negative electrode 130 of the flip chip 100 is electrically connected and soldered to the negative electrode 223 of the sub-mount 220 and the p-layer 243 of the sub-mount 220 via the micro-bump 233 of Au. Thus, the flip chip 100 is fixedly mounted on the sub-mount 220.

The gold wire 57 extending from the metal post 51 is bonded to a bonding pad portion 225 of the positive electrode 221 formed on the sub-mount 220, and the gold wire 58 extending from the metal stem 53 is bonded to a bonding pad portion 227 of the positive electrode 223 formed on the sub-mount 220. The light-emitting element member 270 is placed on the parabolic reflection portion 55 of the lead frame 50 such that the center of the light-emitting element member 270 coincides with the center axis of the parabolic reflection portion 55 (as indicated by broken line D—D in FIG. 5). Subsequently, the lead frame 50 and the light-emitting element member 270 are encased by use of the resin mold 40.

As in the case of the first embodiment, the above-described structure enables fabrication of the light-emitting diode 2 which can provide constant luminous intensity regardless of position of view. Further, without an increase in the size of the light-emitting diode 2 itself, the flip chip 100 can be increased in size in order to increase luminance. Moreover, since a Zener diode is included in the sub-mount 220, without disposition of a Zener diode as an additional part, breakage of the light-emitting diode 2 due to excessive voltage is prevented, so that the durability of the light-emitting diode 2 is improved.

Next, a light-emitting diode 3 according to a third embodiment will be described with reference to FIGS. 6A–6D and FIG. 7.

Figure 6A:
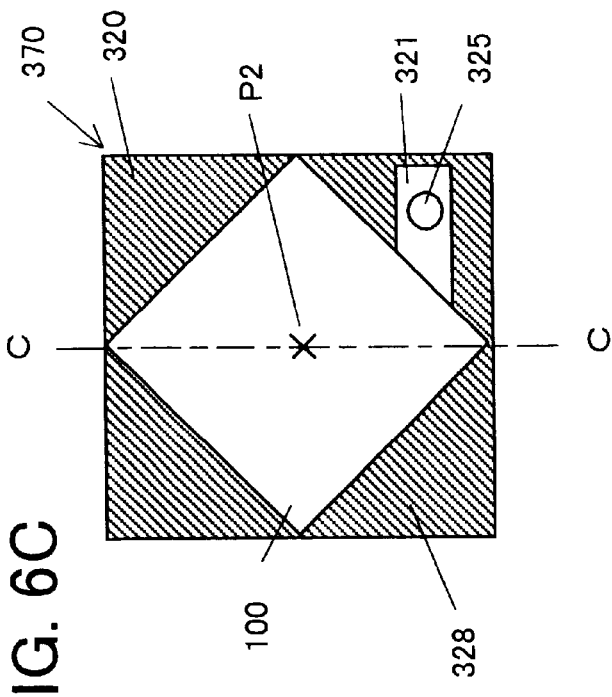
FIGS. 6A–6D and FIG. 7 are explanatory views showing the structure of a light-emitting diode according to a third embodiment of the present invention.
Figure 6C:
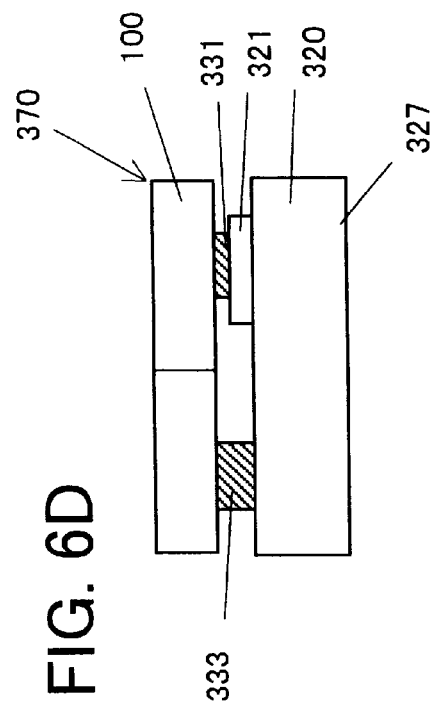
Figure 6B:
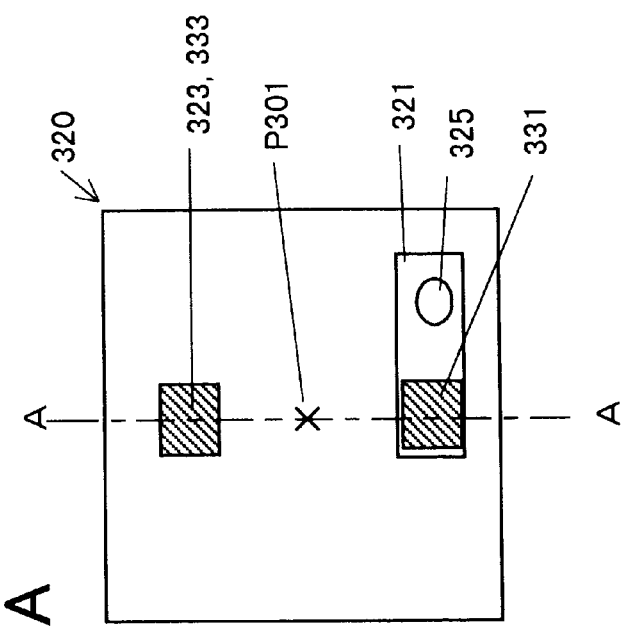
Figure 6D:
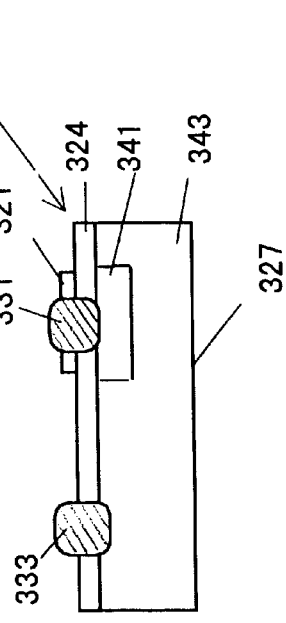
Figure 7:
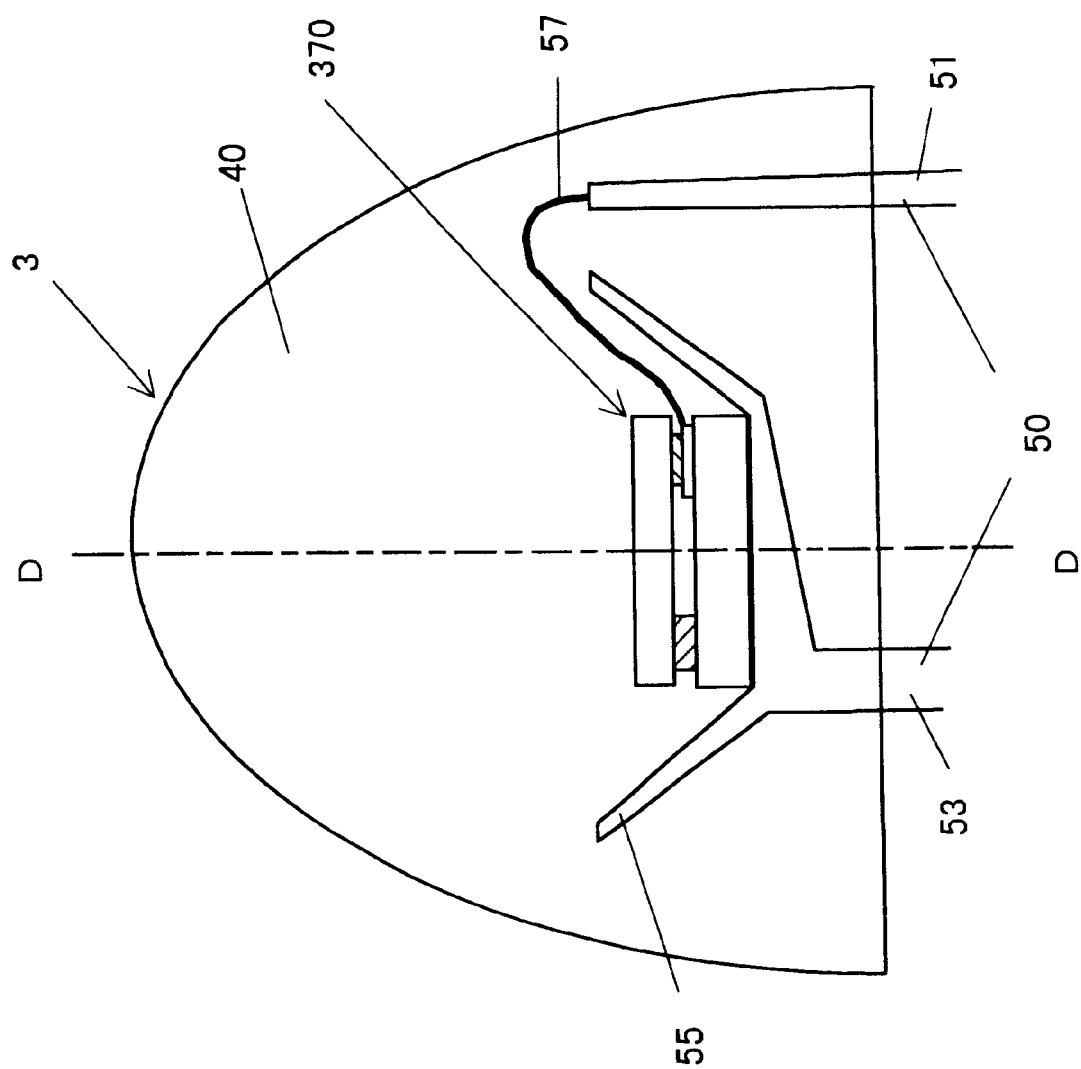
Figure 8:
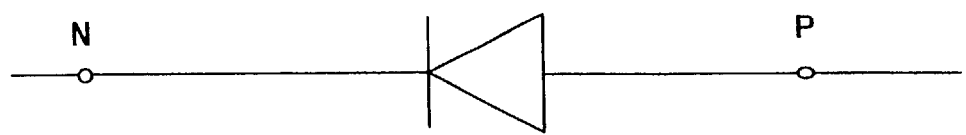
FIG. 8 is a circuit diagram of the first embodiment.

FIG. 6A is a plan view of a sub-mount 320. FIG. 6B is a vertical cross-sectional view of the sub-mount 320 taken along broken line A—A in FIG. 6A. FIG. 6C is a plan view of a light-emitting element member 370 in which the flip chip 100 is mounted on the sub-mount 320 in such a manner that the flip chip 100 is rotated about 45 degrees about the center P2 after being placed such that the center axis A—A passing through the center P301 of the sub-mount 320 coincides with the center axis B—B passing through the center P2 of the flip chip 100. FIG. 6D is a vertical cross-sectional view of the light-emitting element member 370 taken along broken line C—C in FIG. 6C. FIG. 7 is a vertical cross-sectional view schematically showing the appearance and structure of the light-emitting diode 3 according to the third embodiment, in which the light-emitting element member 370 is mounted on the lead frame 50. The structure of the flip chip 100 of the second embodiment is the same as that of the first embodiment shown in FIGS. 1C, 1D, 3A, and 3B.

The sub-mount 320 serving as a substrate is formed of a silicon (Si) substrate 343 into which a group III element is doped and which therefore serves as a p-type lower layer. Subsequently, through doping of a group V element, an n-layer 341 is formed at a portion to which the positive electrode 110 of the flip chip 100 is bonded via a micro-bump 331. The thus-formed p-layer and the n-layer constitute a pn-junction diode, which functions as a Zener diode. Since the action of the Zener diode has been described in the second embodiment, description thereof will be omitted.

Subsequently, the entire upper surface of the sub-mount 320 is covered with an insulation film 324 formed of SiO$_2$. A positive electrode 321 having a strip shape is formed on the insulation film 324 to be located in a triangular exposed region remaining after placement of the flip chip 100 with rotation of about 45 degrees. The positive electrode 321 extends from a corresponding corner to a region where the positive electrode 110 of the flip chip 100 is placed. Further, a window reaching the n-layer 341 is formed by etching in the insulation film 324 at a portion of the positive electrode 321 where the micro-bump 331 is formed. Similarly, a window reaching the p-layer 343 is formed by etching in the insulation film 324 at a portion where the micro-bump 333 is formed.

The light-emitting element member 370 is assembled in the following manner. First, the flip chip 100 is placed on the sub-mount 320 at a position and posture which are obtained through 45-degree rotation of the flip chip 100 about the center P2 from a position at which the center axis A—A passing through the center P301 of the sub-mount 320 coincides with the center axis B—B passing through the center P2 of the flip chip 100. At this position, the positive electrode 110 of the flip chip 100 is electrically connected and soldered to the positive electrode 321 of the sub-mount 320 and the n-layer 341 of the sub-mount 320 via the micro-bump 331 of Au. Similarly, the negative electrode 130 of the flip chip 100 is electrically connected and soldered to the negative electrode 323 of the sub-mount 320 and the p-layer 343 of the sub-mount 320 via a micro-bump 333 of Au. Thus, the flip chip 100 is fixedly mounted on the sub-mount 320.

The gold wire 57 extending from the metal post 51 is bonded to a bonding pad portion 325 of the positive electrode 321 formed on the sub-mount 320. Further, since the sub-mount 320 serving as a negative electrode is formed of a conductive semiconductor substrate, the bottom surface 327 of the sub-mount 320 is bonded to the flat portion 54 of the metal stem 53 by use of silver paste or any other suitable conductive bonding material to thereby be electrically connected thereto. The light-emitting element member 370 is placed on the parabolic reflection portion 55 of the lead frame 50 such that the center of the light-emitting element member 370 coincides with the center axis of the parabolic reflection portion 55 (as indicated by broken line D—D in FIG. 7). Subsequently, the lead frame 50 and the light-emitting element member 370 are encased by use of the resin mold 40. The light-emitting diode 3 is completed.

As in the case of the first embodiment, the above-described structure enables fabrication of the light-emitting diode 3 which can provide constant luminous intensity regardless of position of view. Further, without an increase in the size of the light-emitting diode 3 itself, the flip chip 100 can be increased in size in order to increase luminance. Moreover, since a Zener diode is included in the sub-mount 320 as in the case of the second embodiment, without disposition of a Zener diode as an additional part, breakage of the light-emitting diode 3 due to excessive voltage is prevented, so that the durability of the light-emitting diode 3 is improved. Moreover, since the sub-mount 320 is formed of a conductive semiconductor substrate, the bottom surface 327 of the sub-mount 320 can be used as an electrode used for connection with the metal stem 53. Therefore, electrode formation and wiring through wire-bonding are required to perform for only one electrode, so that the fabrication process of the light-emitting diode 3 can be simplified. If necessary, gold is vapor-deposited on the bottom surface 327 of the sub-mount 320.

Next, a fourth embodiment will be described with reference to FIGS. 10A–10C and FIGS. 11A and 11B.

Figure 10C:
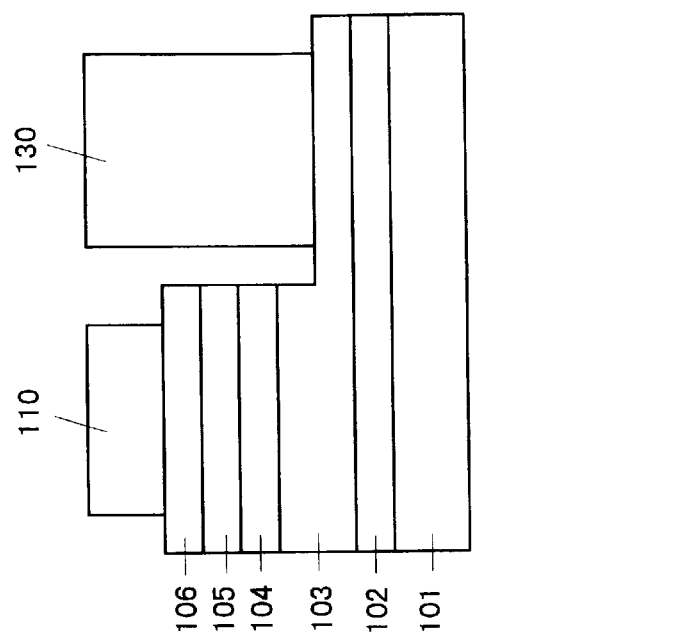
FIGS. 10A–10C and FIGS. 11A and 11B are explanatory views showing the structure of a light-emitting diode according to a fourth embodiment of the present invention.
Figure 10B:
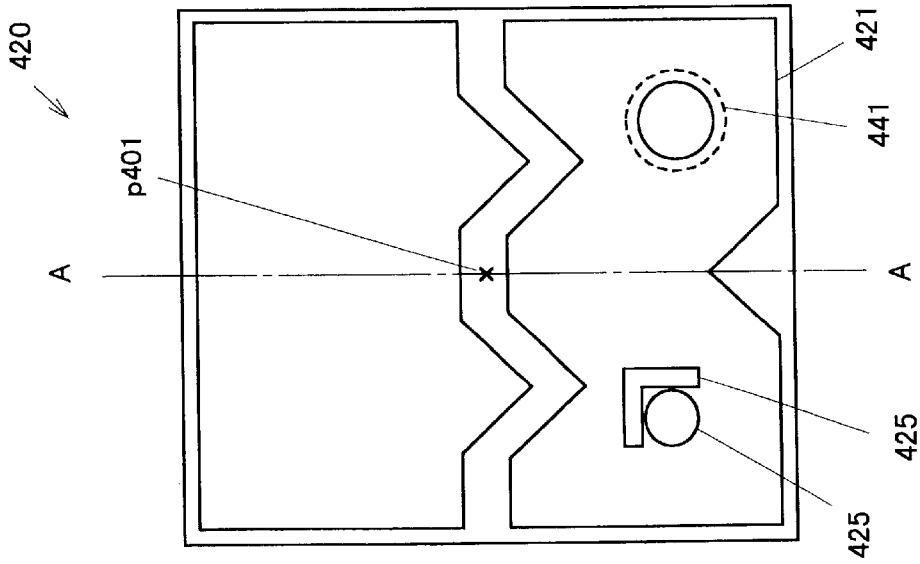
Figure 10A:
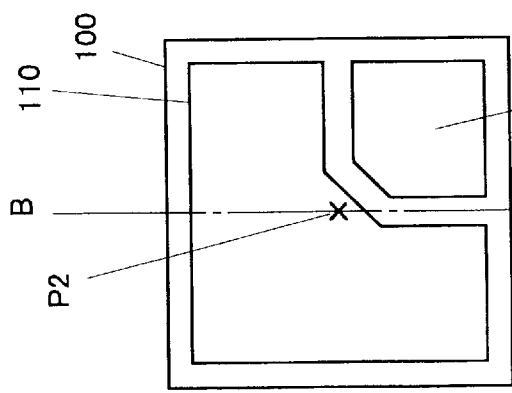
Figure 11B:
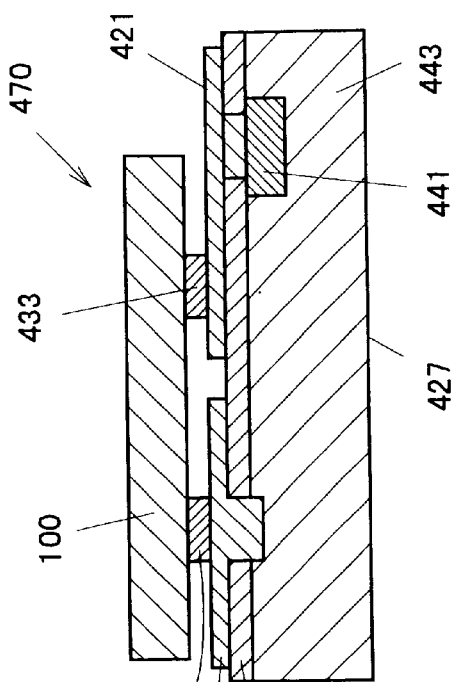
Figure 11A:
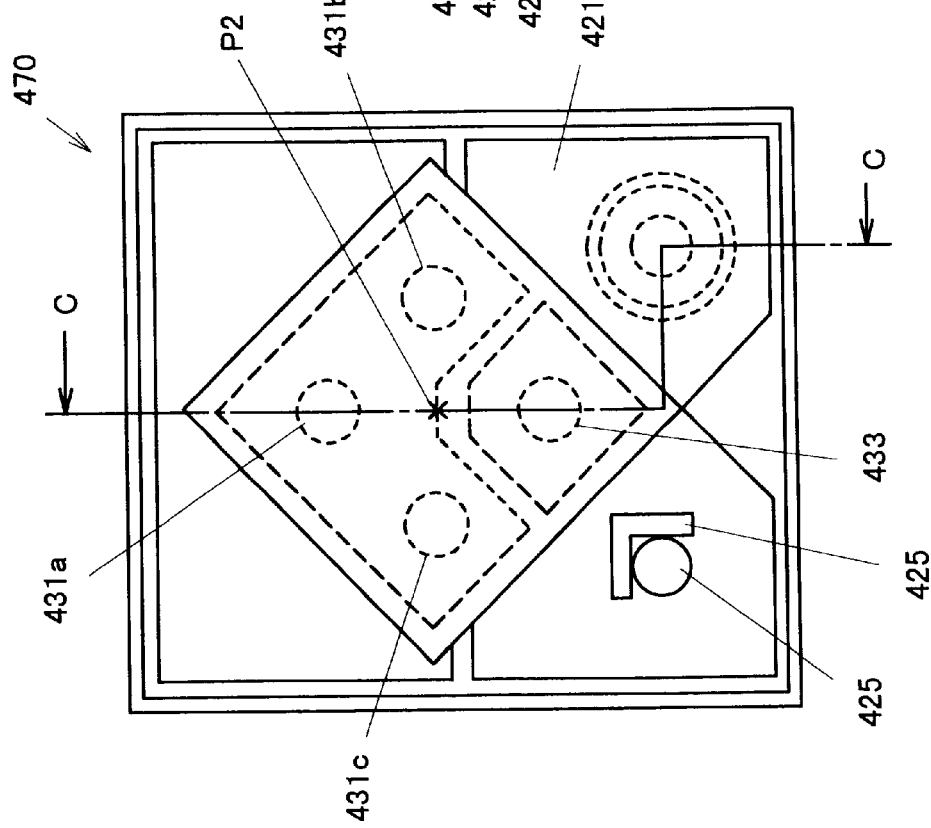
Figure 12B:
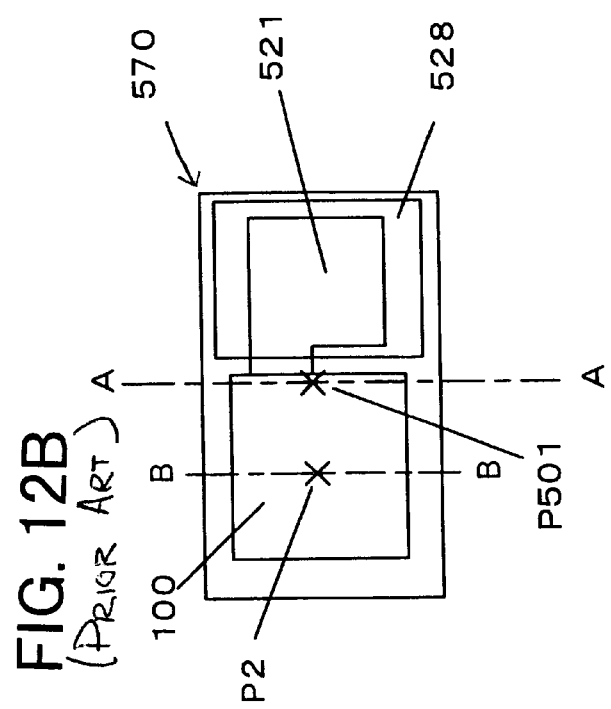
FIGS. 12A–12C and FIG. 13 are explanatory views showing the structure of a conventional light-emitting diode.
Figure 12A:
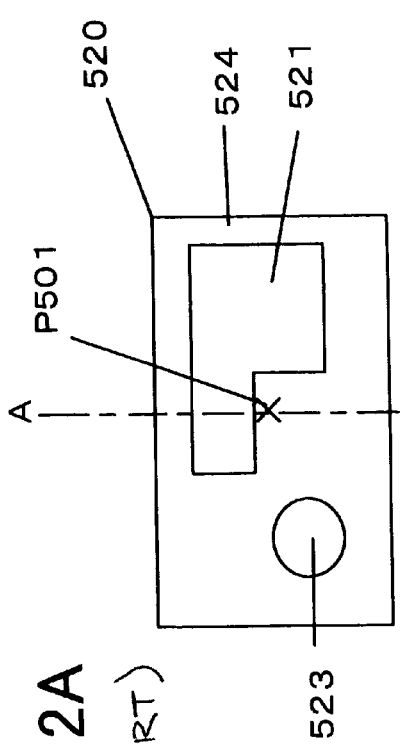
Figure 12C:
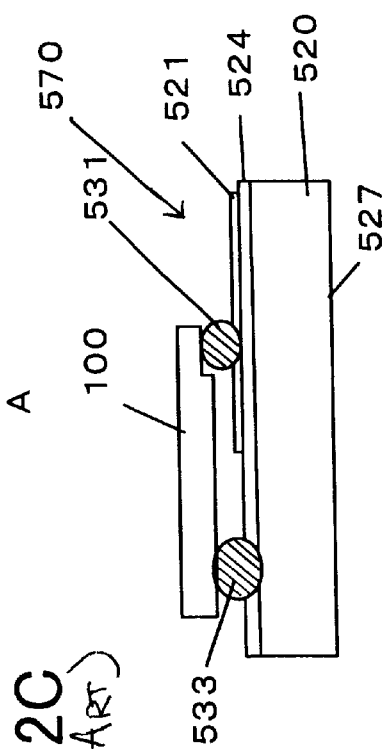
Figure 13:
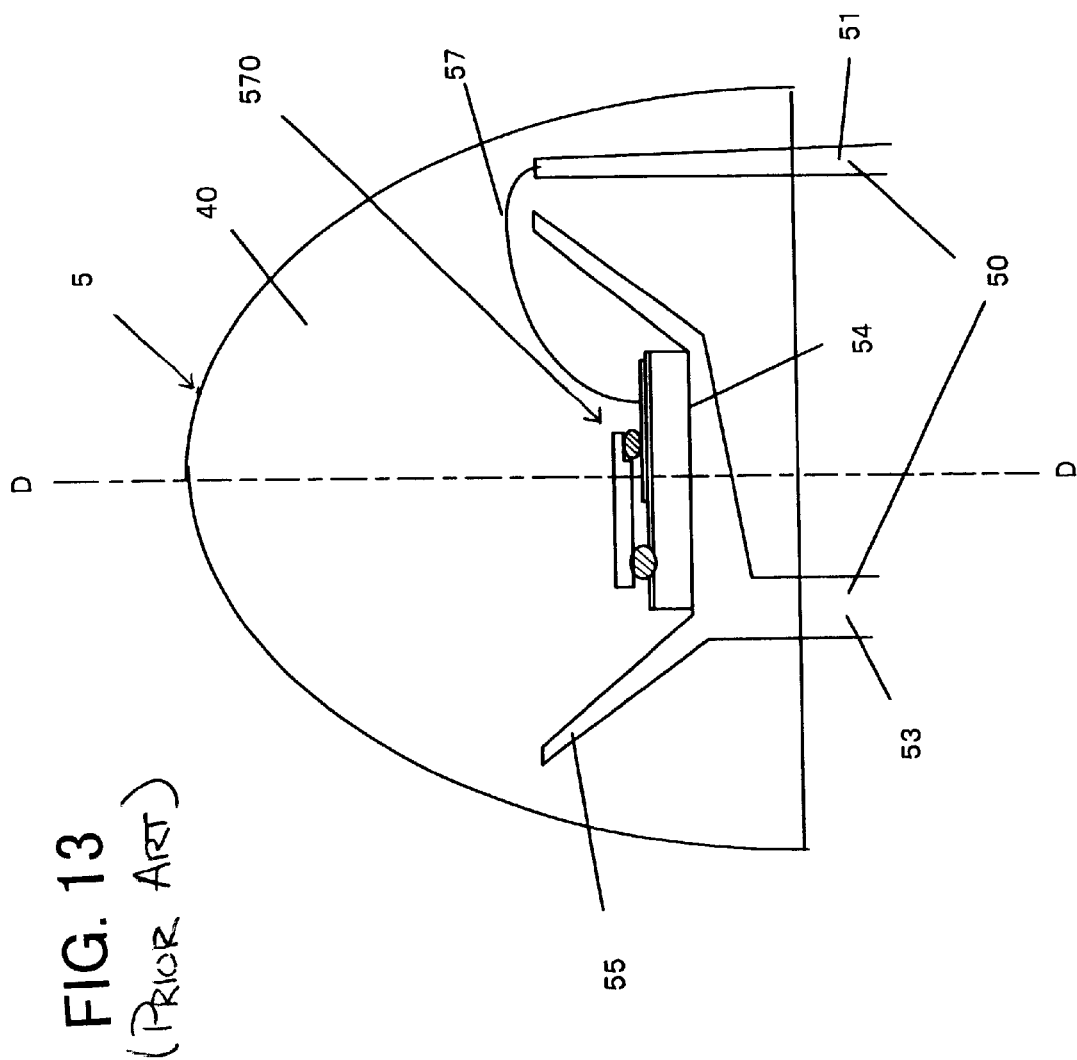

FIG. 10A is a plan view of a flip chip 100. FIG. 10B is a plan view of a sub-mount 420. FIG. 10C is a cross-sectional view showing a layered structure of the flip chip 100. FIG. 11A is a plan view of a light-emitting element member 470 in which the flip chip 100 is mounted on the sub-mount 420 in such a manner that the flip chip 100 is rotated approximately 45 degrees about the center P2 after being placed such that the center axis A—A passing through the center P401 of the sub-mount 420 coincides with the center axis B—B passing through the center P2 of the flip chip 100. FIG. 11B is a cross-sectional view of the light-emitting element member 470 taken along broken line C—C in FIG. 11A.

As shown in FIG. 10A, a positive electrode 110 and a negative electrode 130 are formed on the flip chip 100. Each electrode has a two-layer structure of rhodium (Rh) and gold (Au). Other layers are the same as those shown in FIGS. 3A and 3B, and layers in FIG. 10A having the same functions as respective layers shown in FIG. 3 are denoted by the same reference numbers. In the present embodiment, the insulation film 120 is not used. The electrodes 110 and 130 may be formed of an alloy of rhodium and gold.

The sub-mount 420 serving as a substrate is formed of a silicon (Si) substrate 443 into which an impurity such as a group V element is doped and which therefore serves as an n-type lower layer. Subsequently, through doping of a group III element, a p-layer 441 is formed at a portion in which the flip chip 100 is not existed and under the negative electrode 421 to which the negative electrode 130 of the flip chip 100 is bonded via a micro-bump 433. The thus-formed p-layer and the n-layer constitute a pn-junction diode, which functions as a Zener diode. Although the conductive type is the reverse of that of the Zener diodes described in the second and third embodiments, the structure and action are the same. Therefore, description thereof is omitted.

Subsequently, the entire upper surface of the sub-mount 420 is covered with an insulation film 424 formed of $SiO_2$. Through aluminum vapor deposition, a negative electrode 421, which also serves as a reflection film, is formed on the insulation film 424 to cover two of four upper exposed regions formed as result of placement of the flip chip 100 with rotation of about 45 degrees. That is, the negative electrode 421 is formed over substantially the entirety of a lower half of the upper surface of the sub-mount 420 (in FIG. 11A). The micro-bump 433 is formed on the negative electrode 421 in order to establish connection between the negative electrode 421 and the negative electrode 130 of the flip chip 100. Further, through aluminum vapor deposition, a positive electrode 422, which also serves as a reflection film, is formed on the insulation film 424 in order to cover substantially the entirety of an upper half of the upper surface of the sub-mount 420 (in FIG. 11A). Windows are formed in the insulation film 424, so that the positive electrode 422 is electrically connected to the n-layer (semiconductor substrate) 443 via the windows. Micro-bumps 431*a*, 431*b*, and 431*c* for establishing connection with the positive electrode 110 of the flip chip 100 are formed on the positive electrode 422 at positions corresponding to the windows. Through the micro-bumps 431*a*, 431*b*, and 431*c*, the positive electrode 110 of the flip chip 100 is electrically connected to the n-layer 443. The p-layer 441 is connected to the negative electrode 421 via another window formed in the insulation film 424.

Further, a right-angled mark 425 is formed on the negative electrode 421. The mark 425 is formed through prevention of vapor deposition of aluminum at a portion corresponding to the mark, etching deposited aluminum film at a portion corresponding to the mark, or additional vapor deposition of a material having a different color at a portion corresponding to the mark. The mark 425 can be used for attaining alignment between the flip chip and the sub-mount and for control of position and orientation of the sub-mount during wire-bonding operation. Thus, fabrication of the light-emitting diode can be simplified.

As described above, in the present embodiment, since the negative electrode 421 and the positive electrode 422, both formed of aluminum, together are formed over the entirety of the insulation film on the semiconductor substrate serving as the sub-mount, the negative electrode 421 and the positive electrode 422 constitute a reflection surface. Therefore, light emitted from the flip chip 100 is efficiently reflected off the reflection surface, so that light can be efficiently emitted through the entire surface of the sapphire substrate.

The light-emitting element member 470 is assembled through bonding of the flip chip 100 to the sub-mount 420 at a position and posture which are obtained through 45-degree rotation of the flip chip 100 about the center P2 from a position at which the center axis A—A passing through the center P401 of the sub-mount 420 coincides with the center axis B—B passing through the center P2 of the flip chip 100. The bonding is performed by use of the micro-bumps 431*a*, 431*b*, 431*c*, and 433, which are made of Au.

As in the case shown in FIG. 7, the gold wire 57 extending from the metal post 51 is bonded to a bonding pad portion 425 of the negative electrode 421 formed on the sub-mount 420. Further, since the sub-mount 420 is formed of a conductive semiconductor substrate, a gold deposition layer formed on the bottom surface 427 of the sub-mount 420 is bonded to the flat portion 54 of the metal stem 53 by use of silver paste or any other suitable conductive bonding material to thereby be electrically connected thereto. The light-emitting element member 470 is placed on the parabolic reflection portion 55 of the lead frame 50 such that the center of the light-emitting element member 470 coincides with the center axis of the parabolic reflection portion 55 (as indicated by broken line D-D in FIG. 7). Subsequently, the lead frame 50 and the light-emitting element member 470 are encased by use of the resin mold 40. Thus, the light-emitting diode 3 is completed.

Figure 9:
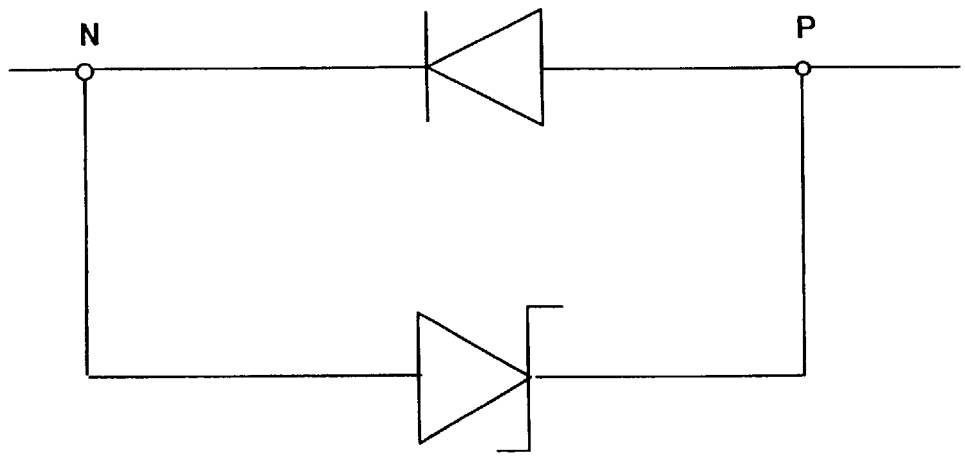
FIG. 9 is a circuit diagram of the second through fourth embodiments.

As in the case of the first through third embodiments, the above-described structure enables fabrication of the light-emitting diode 3 which can provide constant luminous intensity regardless of position of view. Further, without an increase in the size of the light-emitting diode 3 itself, the flip chip 100 can be increased in size in order to increase luminance. Moreover, since a Zener diode is included in the sub-mount 420 as in the case of the second embodiment, without disposition of a Zener diode as an additional part, breakage of the light-emitting diode 3 due to excessive voltage is prevented by means of the circuit configuration shown in FIG. 9, so that the durability of the light-emitting diode 3 is improved. Moreover, since the sub-mount 420 is formed of a conductive semiconductor substrate, the bottom surface 427 of the sub-mount 420 can be used as an electrode used for connection with the metal stem 53. Therefore, electrode formation and wiring through wire-bonding are required to be performed for only one electrode, so that the fabrication process of the light-emitting diode 3 can be simplified.

In the present embodiment, the Zener diode is formed at a portion which is not covered with the flip chip and at which no bump is formed. Therefore, the Zener diode is prevented from being broken due to heat generated by the light-emitting diode, especially heat generated at bumps. Further, since the Zener diode is formed at a portion which does not undergo wire bonding, the Zener diode is prevented from being broken due to heat or from being mechanically deformed during wiring bonding.

Since a reflection film of aluminum is formed on the sub-mount, light can be radiated effectively through an intended light-emitting surface. In order to obtain a satisfactory result, the reflection film is preferably formed on the sub-mount such that the reflection film extends under the flip chip. When the reflection film is formed on the sub-mount to cover portions other than the portion under the flip chip, the brightness of the entire background surface can be increased.

Although the positive electrode 422 and the negative electrode 421 together constitute the reflection film, a reflection film may be formed separately from the positive electrode 422 and the negative electrode 421.

In the present invention, the flip chip is disposed on the sub-mount while being rotated relative thereto, and wiring electrodes for wire bonding are formed in triangular exposed portions of the sub-mount. Therefore, without necessity of decreasing the area of the flip chip, the optical axis of the flip chip can be placed at the center of the sub-mount, so that uniform luminous intensity distribution is obtained.

In the second through fourth embodiments, when the sub-mount is formed of an insulative semiconductor substrate, wiring electrodes can be formed on the surface of the substrate without formation of insulation film on the surface of the substrate. Further, it becomes possible to form a Zener diode within the substrate.

In the present embodiment, the positive electrode 110 of the flip chip 100 is formed of nickel (Ni) or a rhodium (Rh)/gold (Au) layer or alloy, and the negative electrode 130 of the flip chip 100 is formed of nickel (Ni)/silver (Ag) or a rhodium (Rh)/gold (Au) layer or alloy. However, the positive electrode 110 may be a single layer electrode containing at least one metal selected from the group consisting of platinum (Pt), cobalt (Co), gold (Au), palladium (Pd), nickel (Ni), magnesium (Mg), silver (Ag), aluminum (Al), vanadium (V), manganese (Mn), bismuth (Bi), rhenium (Re), copper (Cu), tin (Sn), and rhodium (Rh); or a multi-layer electrode containing two or more metals selected from the above-described group.

Further, the negative electrode 130 may be a single-layer electrode containing at least one metal selected from the group consisting of platinum (Pt), cobalt (Co), gold (Au), palladium (Pd), nickel (Ni), magnesium (Mg), silver (Ag), aluminum (Al), vanadium (V), copper (Cu), tin (Sn), rhodium (Rh), titanium (Ti), chromium (Cr), niobium (Nb), zinc (Zn), tantalum (Ta), molybdenum (Mo), tungsten (W), and hafnium (Hf); or a multi-layer electrode containing two or more metals selected from the above-described group.

Although in the above-described embodiments the angle of rotation of the flip chip 100 is about 45 degrees, the angle of rotation is arbitrary, insofar as exposed regions for electrode wiring can be secured. Further, in the above-described embodiments, exposed regions remaining after placement of the flip chip 100 have the shape of a right-angled isosceles triangle. However, the shape of the triangle is arbitrary.

The insulation films 224 and 324 are not limited to $SiO_2$, and may be formed of any other insulative material such as silicon nitride or titanium oxide. The materials of the microbumps and wire are not limited to Au and may be any other conductive material. In the above-described embodiments, the reflection film and the positive and negative electrodes serving as reflection films are formed through vapor deposition of aluminum. However, the reflection film and the positive and negative electrode may be formed of any other conductive material having a high reflectance. Although the sub-mount 220 used in the second embodiment is formed of an insulative silicon substrate, the sub-mount 220 may be formed of any other insulative semiconductor substrate. Although the sub-mount 320 used in the third embodiment is formed of a conductive silicon substrate, the sub-mount 320 may be formed of any other material which can constitute a p-layer.

Further, in the first to third embodiments, the metal stem 53 serves as a negative terminal, and the metal post 51 serves as a positive terminal, and in the fourth embodiment, the metal stem 53 serves as a positive terminal and the metal post 53 serves as a negative terminal, which is a typical configuration. However, the polarities of the metal stem 53 and the metal post 51 may be reversed. In this case, the positions of the p- and n-layers are reversed.

The diode used for over-voltage protection is not limited to the Zener diode; other suitable diodes such as an avalanche diode may be used.

The operation voltage (Zener voltage) of the diode for over-voltage protection is preferably set to as low a voltage as possible, provided that the operation voltage does not become lower than a drive voltage Vf of a light-emitting element under conditions of use; for example, the lower limit of the Zener voltage=drive voltage Vf of a light-emitting element+variation in drive voltage Vf among mass-produced light-emitting elements+variation in drive voltage Vf due to temperature characteristics of the light-emitting elements+variation in Zener voltage among mass-produced Zener diodes+variation in Zener voltage due to temperature characteristics of the Zener diodes. Through use of such design parameters, the Zener voltage was able to be set to 6.2 V, and the light-emitting diode was able to have an electrostatic breakdown voltage of 3000 V or greater.

The layered structure of the light-emitting diode is not limited to that shown in FIGS. 3A and 3B. The light-emitting layer may employ a single quantum well structure or a multiple quantum well structure.

The light-emitting diode may be a laser. That is, the light-emitting diode may be a surface-emitting laser diode. The substrate of the light-emitting diode is not limited to the sapphire substrate, and may be formed of other materials such as spinel, silicon, silicon carbide, zinc oxide, gallium phosphide, gallium arsenide, magnesium oxide, or manganese oxide.

When the sub-mount is formed of a semiconductor, silicon, gallium arsenide, silicon carbide, and other semiconductor materials may be used.

What is claimed is:

1. A light-emitting diode having a flip-chip-type semiconductor light-emitting element, comprising:
    a flip-chip; and
    a sub-mount including a semiconductor substrate in which a diode for over-voltage protection is formed and on which said flip-chip is placed,
        wherein a first lead electrode and a second lead electrode, contacting electrically with said flip-chip, are formed on said sub-mount, at least one of said first lead electrode and said second lead electrode includes a bonding pad for wire bonding, and said diode for over-voltage protection is formed in a region which is not covered by any portion of said bonding pad.

2. The light-emitting diode according to claim 1, wherein said flip-chip is positioned on said sub-mount by superposition of a center point and center axis of the flip-chip on a center point and center axis of the sub-mount, and subsequent rotation of said flip-chip about the center points by a predetermined angle.

3. The light-emitting diode according to claim 2, wherein the predetermined angle is about 45 degrees.

4. The light-emitting diode according to claim 1, wherein said sub-mount includes an insulation film formed on an upper surface of said substrate, and
    wherein at least one of said first lead electrode and said second lead electrode for said flip-chip is formed on said insulation film located in an upper exposed region remaining after placement of said flip-chip.

5. The light-emitting diode according to claim 1, wherein a bottom surface of said semiconductor substrate serves as one of said first lead electrode and said second lead electrode for said flip-chip, and
    wherein said semiconductor substrate is directly connected to a lead frame adapted for receiving said semiconductor substrate and application of voltage to said flip-chip.

6. The light-emitting diode according to claim 1, wherein said semiconductor substrate is insulating, and
    wherein said first lead electrode and said second lead electrode for said flip-chip are formed on said sub-mount to be located in an upper exposed region remaining after placement of said flip-chip.

7. The light-emitting diode according to claim 1, wherein a mark for detecting a position or a posture of said sub-mount is formed on an upper exposed region of said sub-mount.

8. The light-emitting diode according to claim 1, wherein a reflection film for reflecting light emitted from said flip-chip is formed on said sub-mount.

9. The light-emitting diode according to claim 1, wherein at least one of said first lead electrode and said second lead electrode serves as a reflection film for reflecting light emitting from said flip-chip.

10. The light-emitting diode according to claim 1, wherein said first lead electrode and said second lead electrode are formed to cover an area below said flip-chip and serve as reflection films for reflecting light emitted from said flip-chip.

11. The light-emitting diode according to claim 1, wherein said first lead electrode and said second lead electrode are formed to cover substantially an entirety of an upper surface of said sub-mount and serve as reflection films for reflecting light emitted from said flip-chip.

12. The light-emitting diode according to claim 1, wherein said first lead electrode and said second lead electrode comprise a positive electrode and a negative electrode, respectively.

13. A light-emitting diode having a flip-chip-type semiconductor light-emitting element, comprising:

a flip-chip; and a sub-mount including a semiconductor substrate in which a diode for over-voltage protection is formed and on which said flip-chip is placed, wherein a first lead electrode and a second lead electrode, contacting electrically with said flip-chip, are formed on said sub-mount, at least one of said first lead electrode and said second lead electrode includes a bonding pad for wire bonding, and said diode is formed other than below said bonding pad.

* * * * *